United States Patent [19]
Yazawa

[11] Patent Number: 4,588,902
[45] Date of Patent: May 13, 1986

[54] ANALOG SWITCHING CIRCUIT WITH ZENER DIODE INPUT CLAMP

[75] Inventor: Nobuharu Yazawa, Hyogo, Japan

[73] Assignee: Mitsubishi Denki Kabushiki Kaisha, Tokyo, Japan

[21] Appl. No.: 530,826

[22] Filed: Sep. 9, 1983

[30] Foreign Application Priority Data

Sep. 9, 1982 [JP] Japan .................................. 57-158503

[51] Int. Cl.[4] .......................................... H03G 11/02
[52] U.S. Cl. ................................ 307/200 A; 307/254; 307/318; 307/491; 307/495
[58] Field of Search ............ 307/200 A, 443, 454–455, 307/491, 495, 544, 551, 556, 570, 253, 254, 283, 318

[56] References Cited

U.S. PATENT DOCUMENTS

| | | | |
|---|---|---|---|
| 3,584,920 | 6/1971 | Sills ................................ | 307/318 X |
| 3,965,374 | 6/1976 | Peterson et al. ................ | 307/253 X |
| 4,138,612 | 2/1979 | Schlesinger ..................... | 307/318 X |
| 4,236,088 | 11/1980 | Horiuchi et al. ............... | 307/254 X |
| 4,256,980 | 3/1981 | Asada et al. .................... | 307/254 |
| 4,367,419 | 1/1983 | Yazawa et al. .................. | 307/254 |

OTHER PUBLICATIONS

Hart, "Inverter Circuit with Hall Effect Device", IBM Tech. Disc. Bull., vol. 16, No. 9, Feb. 1974, p. 2985.
Campbell, "Analog Switch Employing Common Mode Rejection", *RCA Technical Notes*, RCA Tn No. 734, Jan. 1968, pp. 1–2.

*Primary Examiner*—Stanley D. Miller
*Assistant Examiner*—D. R. Hudspeth
*Attorney, Agent, or Firm*—Subhrue, Mion, Zinn, Macpeak & Seas

[57] ABSTRACT

The present invention provides an analog switching circuit including an input transistor, a base of which receives an input signal. A switching transistor has its emitter connected in common with the emitter of the input transistor and a constant current source is connected between the common emitter and ground. A control transistor effects ON and OFF control of the switching transistor in accordance with a control signal, and an output transistor extracts an output signal from the common emitter of the input transistor and switching transistor. An input clamping circuit composed of two or more Zener diodes connected in series with each other and in the reverse direction with respect to each other, is connected between the base of the switching transistor and the base bias point of the input transistor so that the base voltage of the switching transistor is increased, thereby avoiding reverse bias of the input transistor upon receiving a large amplitude input signal.

4 Claims, 3 Drawing Figures

ANALOG SWITCHING CIRCUIT WITH ZENER DIODE INPUT CLAMP

BACKGROUND OF THE INVENTION

The present invention relates to an analog switching circuit provided with an input clamping circuit.

Referring to FIG. 1, a conventional analog switching circuit with two input terminals is shown. In FIG. 1, reference characters $Q_{1A}$, $Q_{1B}$, $Q_{2A}$, $Q_{2B}$, $Q_{3A}$, $Q_{3B}$, $Q_{4A}$ and $Q_{4B}$ denote transistors; $I_A$, $I_B$, constant current sources; $R_{1A}$, $R_{1B}$, $R_{2A}$, $R_{2B}$ and $R_L$, resistors; A and B, input terminals; OUT, the output terminal; $V_1$, a bias voltage; $V_A$, $V_B$, control signals having reversed phase with respect to each other; and $V_{cc}$, the power supply voltage.

When the control signal $V_A$ is at a high level "H", the transistor $Q_{4A}$ assumes the ON state. Then the transistor $Q_{2A}$ becomes OFF because the base of the transistor $Q_{2A}$ is grounded, and the transistor $Q_{1A}$ functions as an emitter follower and a base bias voltage is applied to the transistor $Q_{3A}$. Therefore, the transistor $Q_{3A}$ also functions as an emitter follower and the input signal A is output from the output terminal OUT through the transistors $Q_{1A}$ and $Q_{3A}$. The DC voltage of the output is cancelled by the voltage between the base and emitter of the transistors $Q_{1A}$ and $Q_{3A}$, and it becomes approximately equal to the input DC bias voltage $V_1$.

On the other hand, on the side of the input signal B, the control signal $V_B$ is at a low level "L" and the transistor $Q_{4B}$ is in the OFF state. The base voltage of the transistor $Q_{2B}$ is increased through the resistor $R_{2B}$ connected to the power supply voltage $V_{cc}$, so that the transistor $Q_{2B}$ turns ON, and in turn the transistor $Q_{1B}$ is made OFF because of the increment to the emitter voltage of the transistor $Q_{1B}$. Therefore, the input signal B is not transmitted to the output terminal OUT, and the analog switching circuit is in an OFF state.

There is a problem in that an inverse breakdown current flows between the base and the emitter of the transistor $Q_{1B}$ when the voltage between the bases of the transistors $Q_{1B}$ and $Q_{2B}$ exceeds the sum of the voltage between the base and emitter of the transistor $Q_{2B}$ and the Zener voltage between the emitter and base of the transistor $Q_{1B}$. This causes lowering of the $h_{FE}$ of the transistor $Q_{1B}$, and in the case where the control signal $V_B$ is a high level "H" and the input signal B is transmitted to the output terminal OUT, the input bias current undesirably increases, thereby introducing deterioration of the circuit characteristics. This is especially notable when the power supply voltage $V_{cc}$ is high.

It has been considered to resolve the above problem by clamping the control voltage to be applied to the bases of the transistors $Q_{2A}$ and $Q_{2B}$ by means of a Zener diode. A portion of a conventional analog switch having such a Zener diode is shown in FIG. 2.

Referring to FIG. 2, $Q_1$ denotes an input transistor for receiving an input A at its base; $Q_2$, a switching transistor having the same polarity as the input transistor $Q_1$, the emitter of the switching transistor $Q_2$ being connected in common with the emitter of the input transistor $Q_1$; $Q_4$, a control transistor having its emitter connected to ground and its collector connected to the base of the switching transistor $Q_2$ for controlling the ON and OFF states of the switching transistor $Q_2$ in accordance with the control signal $V_A$; $Q_3$, an output transistor having its collector connected to ground and its base connected to the common emitter of the transistors $Q_1$ and $Q_2$ for operating the emitter follower thereof; I, a constant current source connected between the common emitter of the transistors $Q_1$ and $Q_2$ and ground; $V_1$, a bias voltage applied to the transistor $Q_1$; $R_1$, $R_2$ and $R_L$, resistors; and ZD, a Zener diode for providing a base bias equal to a Zener voltage to the switching transistor $Q_2$ when the control transistor $Q_4$ is in the OFF state.

Where the control transistor $Q_4$ is in the OFF state, namely in a switch-OFF mode where the switching transistor $Q_2$ is in the ON state and the input signal A is not transmitted, the base voltage of the switching transistor $Q_2$ becomes equal to the Zener voltage $V_z$ because the switching transistor $Q_2$ is biased by the power supply voltage $V_{cc}$ through the resistor $R_2$ and the Zener diode ZD. At this time, if the input signal A exceeds the Zener voltage $V_z$, the input transistor $Q_1$ switches from the OFF state to the ON state, and then the switching transistor $Q_2$ switches to the OFF state, thereby undesirably transmitting the input signal A to the output terminal. Namely, the input signal A is undesirably transmitted even though the analog switching circuit is in the switch-OFF mode. If the power supply voltage $V_{cc}$ is high, the base bias voltage $V_1$ of the input transistor $Q_1$ is also increased in proportion to the power supply voltage, and therefore the dynamic range of the input signal A is undesirably limited to a narrow range $V_z - V_1$ and a small amplitude, which constitutes a defect of the conventional analog switch.

SUMMARY OF THE INVENTION

The object of the present invention is to eliminate the defects of the conventional analog switch, and to provide an analog switching circuit comprising an input transistor, a base of which receives the input signal; a switching transistor having the same polarity as the input transistor, with the emitter of the switching transistor being connected in common with the emitter of the input transistor; a constant current source connected between the common emitter and ground; a control transistor for effecting ON and OFF control of the switching transistor in accordance with a control signal; an output transistor for extracting an output signal from the common emitter of the input transistor and switching transistor; and an input clamping circuit composed of two or more Zener diodes connected in series with each other and in the reverse direction with respect to each other, and connected between the base of the switching transistor and the base bias point of the input transistor; whereby the base voltage of the switching transistor is increased, thereby avoiding reverse bias of the input transistor upon receiving a large amplitude input signal.

BRIEF DESCRIPTION OF THE DRAWINGS

An embodiment of the present invention will be explained hereinafter with reference to the following drawings, in which.

DETAILED DESCRIPTION OF THE PREFERRED EMBODIMENT

Figure 3:
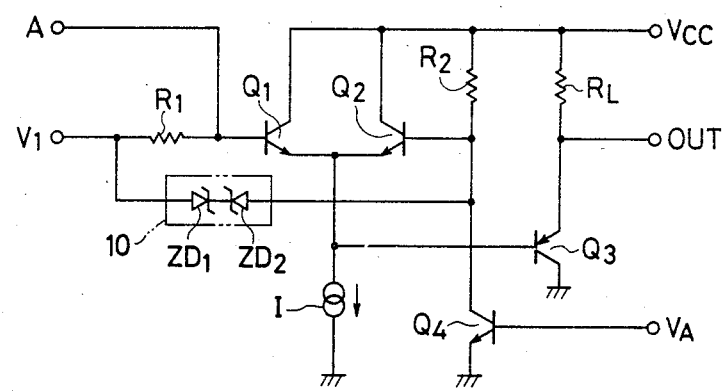
FIG. 3 is an example of an analog switching circuit according to the present invention.

Referring now to FIG. 3 a portion of an analog switching circuit of the embodiment is shown. In FIG.

Figure 1:
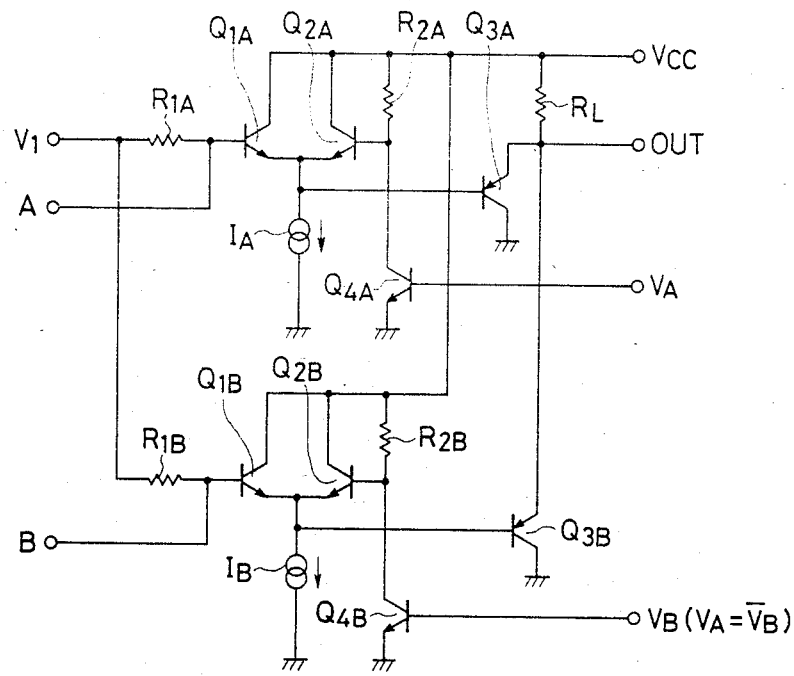
FIGS. 1 and 2 are circuit diagrams respectively showing conventional analog switches.
Figure 2:
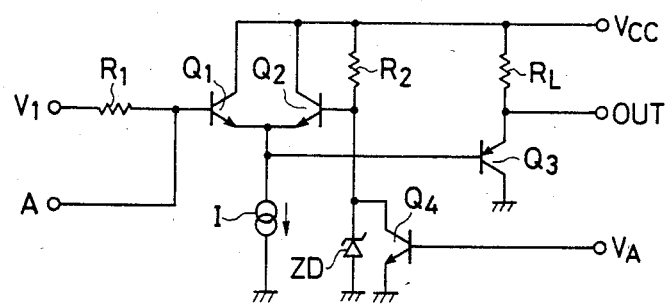

3, the same numerals and characters denote the same parts as in FIG. 2. Numeral 10 denotes an input clamping circuit composed of two Zener diodes reversely connected in series with each other, and the input clamping circuit is connected between the base of the switching transistor $Q_2$ and the base bias voltage $V_1$ of the input transistor $Q_1$.

In the operation of the analog switching circuit of the present invention, when the transistor $Q_4$ is in the OFF state, the base voltage of the transistor $Q_2$ is $(V_1+V_z+V_f)$, where $V_f$ is the forward voltage of one Zener diode. In this case, if the base voltage of the input transistor $Q_1$, i.e. the input signal amplitude, does not exceed $(V_1+V_z+V_f)$, the input signal A is in no way leaked, or transmitted, to the output terminal.

Further this level changes in proportion to the bias voltalge $V_1$, so that the dynamic range of the input signal A becomes $(V_f+V_z)$, and the level does not change with the power supply voltage $V_{cc}$.

Further, since the input clamping circuit 10 is not connected to the base of the input transistor $Q_1$ directly, no increase in input capacitance is produced, thereby providing an analog switch circuit with a less phase rotation within a wide range from D.C. to high frequencies.

As mentioned above, according to the present invention, there is provided an analog switching circuit comprising an input transistor, a base of which receives an input signal; a switching transistor having the same polarity as the input transistor with the emitter of the switching transistor being connected in common with the emitter of the input transistor; a constant current source connected between the common emitter and ground; a control transistor for effecting ON and OFF control of the switching transistor in accordance with a control signal; an output transistor for extracting an output signal from the common emitter; and an input clamping circuit composed of two or more Zener diodes connected in series with each other and reversed with respect to each other, and connected between the base of the switching transistor and the base bias point of the input transistor; whereby the base voltage of the switching transistor can be increased to avoid a reverse bias of the input transistor upon receiving a large amplitude input, to increase the dynamic range of the input signal, and further to minimize the phase rotation of the input signal by restricting any increase in input capacitance.

What is claimed is:

1. An analog switching circuit, comprising:
   an input transistor having a base to which an input signal is applied and an emitter from which a signal corresponding to the input signal is outputted;
   a bias resistor for coupling a bias voltage to said base of said input transistor;
   a switching transistor having an emitter commonly connected to the emitter of said input transistor;
   a constant current source connected between the common emitter of said input and said switching transistors and ground;
   a control transistor for turning said switching transistor ON and OFF in accordance with a control signal; and
   an input clamping circuit comprising at least a pair of Zener diodes connected in series and poled in opposition to each other, a first terminal of said input clamping circuit being connected to a base of said switching transistor, and a second terminal thereof being coupled to a base of said input transistor through said bias resistor.

2. An analog switching circuit as claimed in claim 1, further including an output transistor for extracting an output signal from the common emitter of said input and switching transistors, and an output terminal connected between a power supply and an emitter of said output transistor.

3. An analog switching circuit as claimed in claim 1, wherein said switching transistor and said input transistor are of the same polarity.

4. An analog switching circuit, comprising:
   an input transistor having a base to which an input signal is applied, said base being connected through a resistor to a bias point to which a predetermined bias voltage is applied;
   a switching transistor having an emitter commonly connected to the emitter of said input transistor, a polarity of said switching transistor being the same as that of said input transistor;
   a constant current source connected between the common emitter of said input and said switching transistors and ground;
   a control transistor for turning said switch transistor ON and OFF in accordance with a control signal;
   an output transistor for extracting an output signal from the common emitter of said input and switching transistors; and
   an input clamping circuit comprising at least a pair of Zener diodes connected in series and poled in opposition with respect to each other, a first terminal of said input clamping circuit being connected to the base of said switching transistor; and a second terminal thereof being connected to the base bias point.

* * * * *